(12) United States Patent
Hill

(10) Patent No.: US 11,773,811 B2
(45) Date of Patent: Oct. 3, 2023

(54) INTAKE PLASMA GENERATOR SYSTEMS AND METHODS

(71) Applicant: ThrivalTech, LLC, Lafayette, CO (US)

(72) Inventor: Garrett Hill, Boulder, CO (US)

(73) Assignee: THRIVALTECH, LLC, Lafayette, CO (US)

( * ) Notice: Subject to any disclaimer, the term of this patent is extended or adjusted under 35 U.S.C. 154(b) by 0 days.

(21) Appl. No.: 17/834,352

(22) Filed: Jun. 7, 2022

(65) Prior Publication Data

US 2022/0298995 A1   Sep. 22, 2022

Related U.S. Application Data

(63) Continuation of application No. 17/198,564, filed on Mar. 11, 2021, now Pat. No. 11,352,988, which is a
(Continued)

(51) Int. Cl.
*F02M 27/04* (2006.01)
*F02M 35/10* (2006.01)
*H01J 37/32* (2006.01)

(52) U.S. Cl.
CPC .... *F02M 27/042* (2013.01); *F02M 35/10019* (2013.01); *F02M 35/10222* (2013.01);
(Continued)

(58) Field of Classification Search
CPC ........... F02M 27/042; F02M 35/10019; F02M 35/10222; F02M 35/10249;
(Continued)

(56) References Cited

U.S. PATENT DOCUMENTS

| 1,873,746 A | 8/1932 | English |
| 2,476,095 A | 7/1949 | Houghland |

(Continued)

FOREIGN PATENT DOCUMENTS

| CN | 101701558 | 12/2011 |
| EP | 2458188 B1 | 4/2014 |

(Continued)

OTHER PUBLICATIONS

Search Report for related PCT Application PCT/US2019/046016; dated Jun. 12, 2020.

*Primary Examiner* — Jacob M Amick
(74) *Attorney, Agent, or Firm* — Fish IP Law, LLP

(57) ABSTRACT

Disclosed are systems, methods, and devices for generating radicals in an air stream at the intake of an internal combustion engine, as well as increasing the thrust of such air streams into the engine. A plasma generator including plasma actuators, dielectric barrier discharge electrodes, or both is positioned in the intake stream. Plasma actuators are disposed on the interior surface of the plasma generator, exposed to the intake stream. Dielectric barrier discharge electrodes protrude into the intake air stream. Plasma, preferably DBD plasma, glow plasma, or filamentary plasma, is generated in the air intake stream, creating radicals in the stream, mixing the radicals in the stream, and reducing drag while increasing thrust of air in the intake stream. A concentric cylinder can be further disposed in the plasma generator, with further plasma actuators, dielectric barrier discharge electrodes, or both, on the interior and exterior surfaces of the cylinder.

20 Claims, 17 Drawing Sheets

Related U.S. Application Data continuation of application No. 16/537,319, filed on Aug. 9, 2019, now Pat. No. 10,947,933.

(60) Provisional application No. 62/716,531, filed on Aug. 9, 2018.

(52) U.S. Cl.
CPC . *F02M 35/10249* (2013.01); *H01J 37/32458* (2013.01); *H01J 37/32541* (2013.01); *H01J 37/32559* (2013.01); *H01J 37/32908* (2013.01)

(58) Field of Classification Search
CPC .......... H01J 37/32458; H01J 37/32541; H01J 37/32559; H01J 37/32908
See application file for complete search history.

(56) References Cited

U.S. PATENT DOCUMENTS

| | | |
|---|---|---|
| 3,110,294 A | 11/1963 | Nyman |
| 3,266,783 A | 8/1966 | Knight |
| 3,476,095 A | 11/1969 | Kraffe De Laubarede |
| 3,711,743 A | 1/1973 | Bolasny |
| 3,746,095 A | 7/1973 | Sparlin |
| 3,761,062 A | 9/1973 | King et al. |
| 3,963,408 A | 6/1976 | Youngberg |
| 3,989,017 A | 11/1976 | Reece |
| 4,071,004 A | 1/1978 | Ostergaard |
| 4,789,801 A | 12/1988 | Lee |
| 5,791,275 A | 8/1998 | Bandyopadhyay |
| 5,934,622 A | 8/1999 | Meng |
| 5,964,433 A | 10/1999 | Nosenchuck |
| 5,971,275 A | 10/1999 | Leduc et al. |
| 6,811,757 B2 | 11/2004 | Niv et al. |
| 8,028,682 B2 | 10/2011 | Clack |
| 8,282,337 B2 | 10/2012 | Wadia et al. |
| 9,624,880 B2 | 4/2017 | Ito et al. |
| 10,436,127 B2 | 10/2019 | Inoue et al. |
| 11,352,988 B2 * | 6/2022 | Hill ................... F02M 35/10019 |
| 2001/0042372 A1 * | 11/2001 | Khair ..................... F02M 26/35 60/275 |
| 2007/0183944 A1 * | 8/2007 | Shawcross ............. B01D 46/50 422/186.04 |
| 2008/0116808 A1 | 5/2008 | McClure et al. |
| 2010/0192542 A1 * | 8/2010 | Min ....................... C01B 13/10 60/275 |
| 2011/0247596 A1 | 10/2011 | Clack |
| 2017/0303439 A1 | 10/2017 | Cader et al. |
| 2019/0040616 A1 | 2/2019 | Coronado et al. |
| 2019/0078520 A1 | 3/2019 | Inoue et al. |

FOREIGN PATENT DOCUMENTS

| | | |
|---|---|---|
| JP | 5260546 | 6/2008 |
| JP | 5700974 | 8/2010 |
| JP | 2012038587 | 2/2012 |
| JP | 2012180799 | 9/2012 |
| JP | 2013131488 | 7/2013 |
| JP | 2013155673 | 8/2013 |
| JP | 6260546 | 1/2015 |
| JP | 201689688 | 4/2016 |
| JP | 6340752 | 10/2017 |
| KR | 101295810 | 11/2012 |

\* cited by examiner

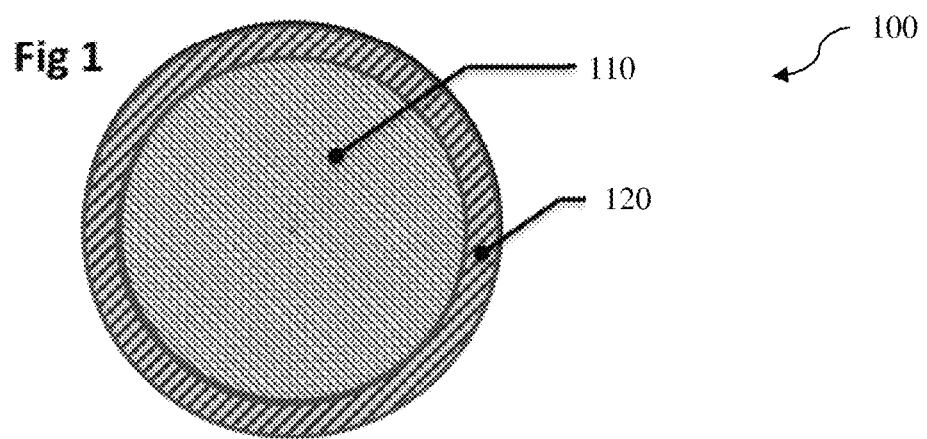
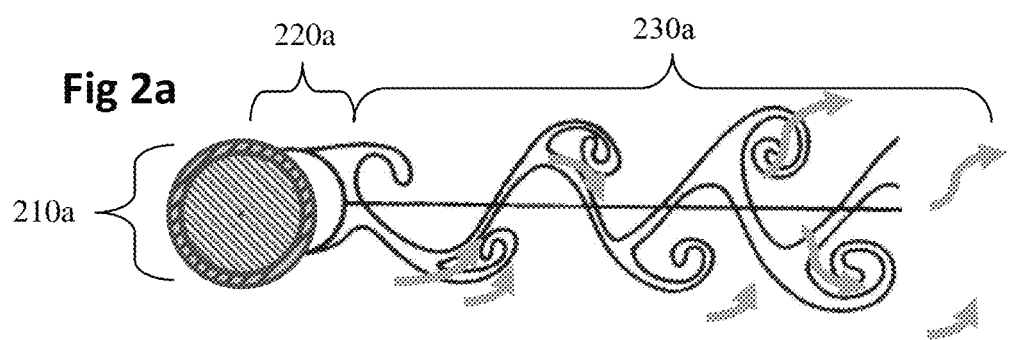
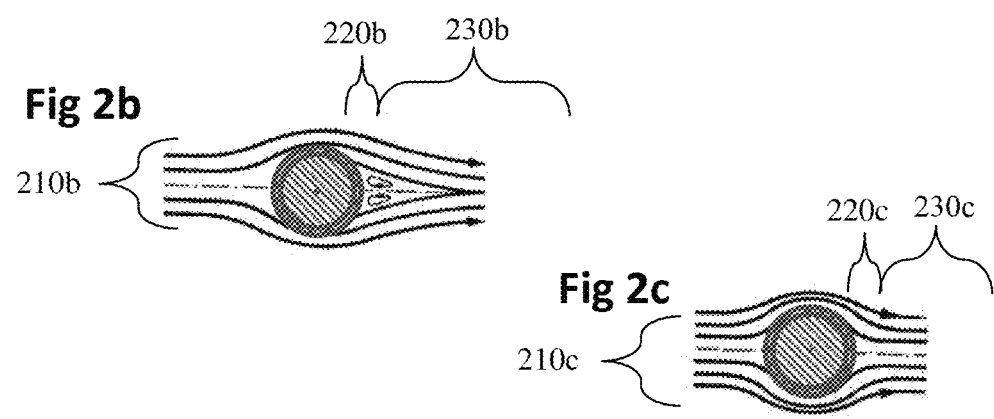

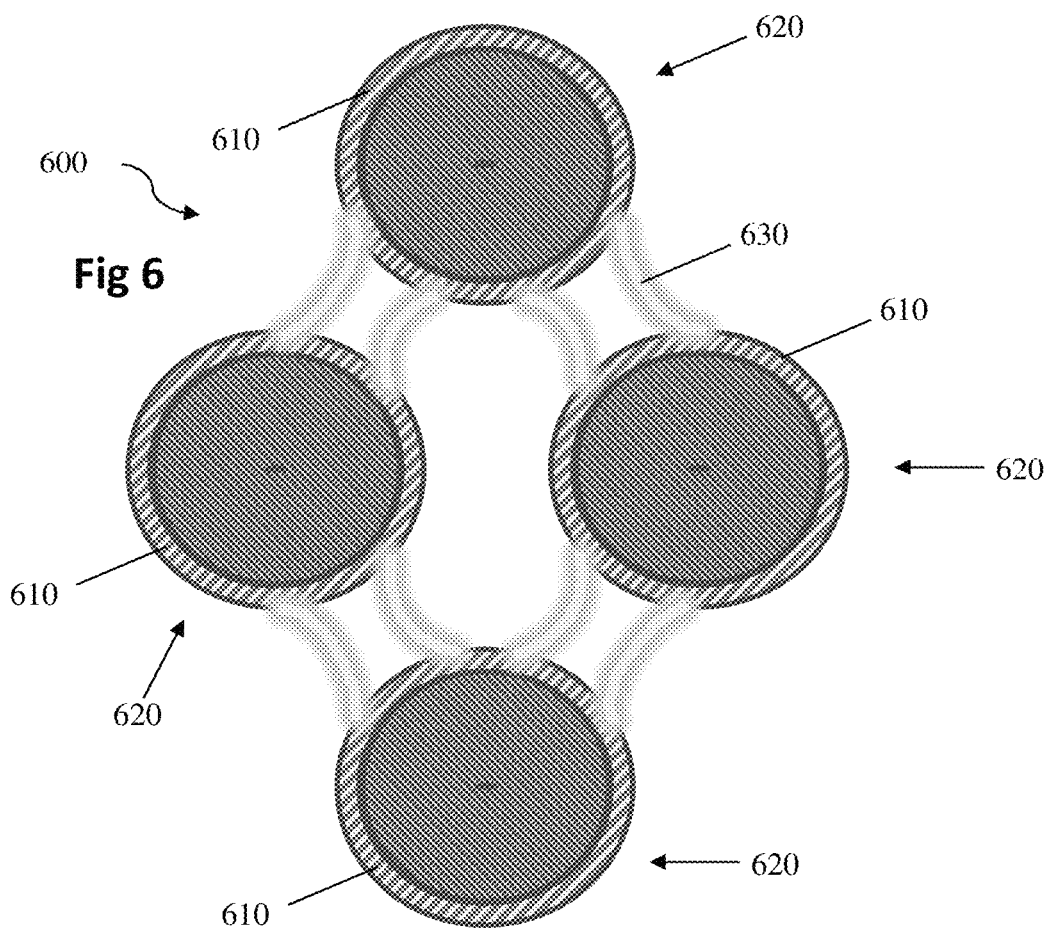
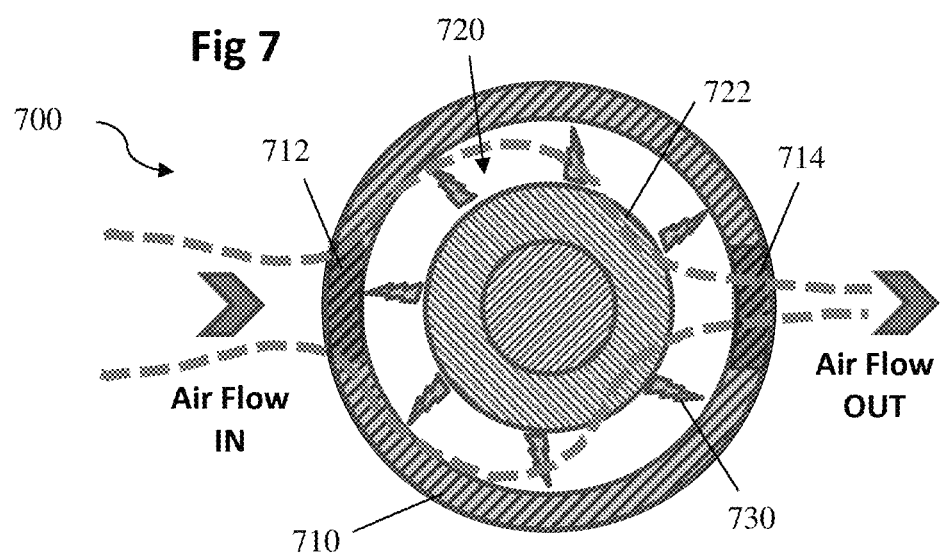

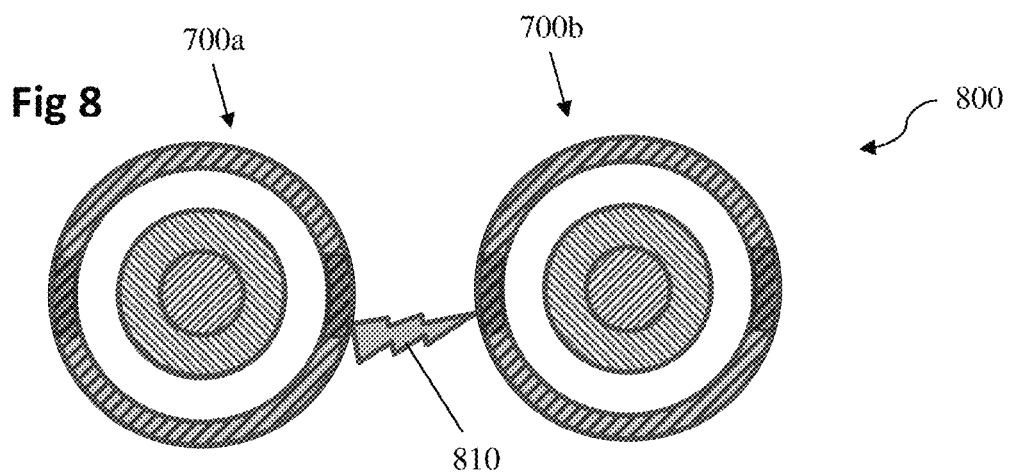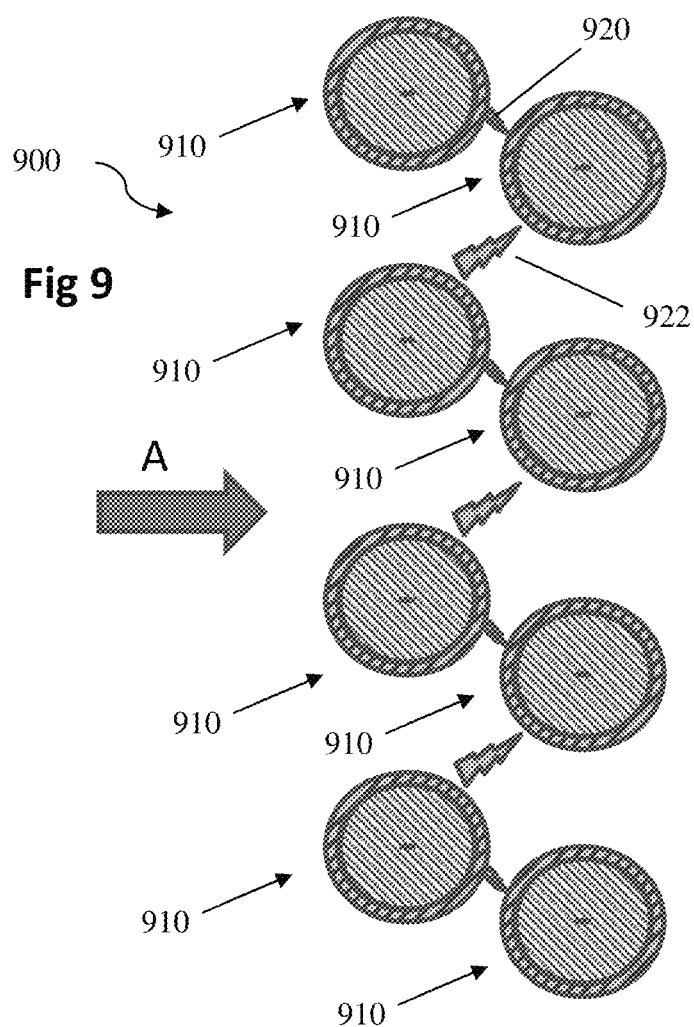

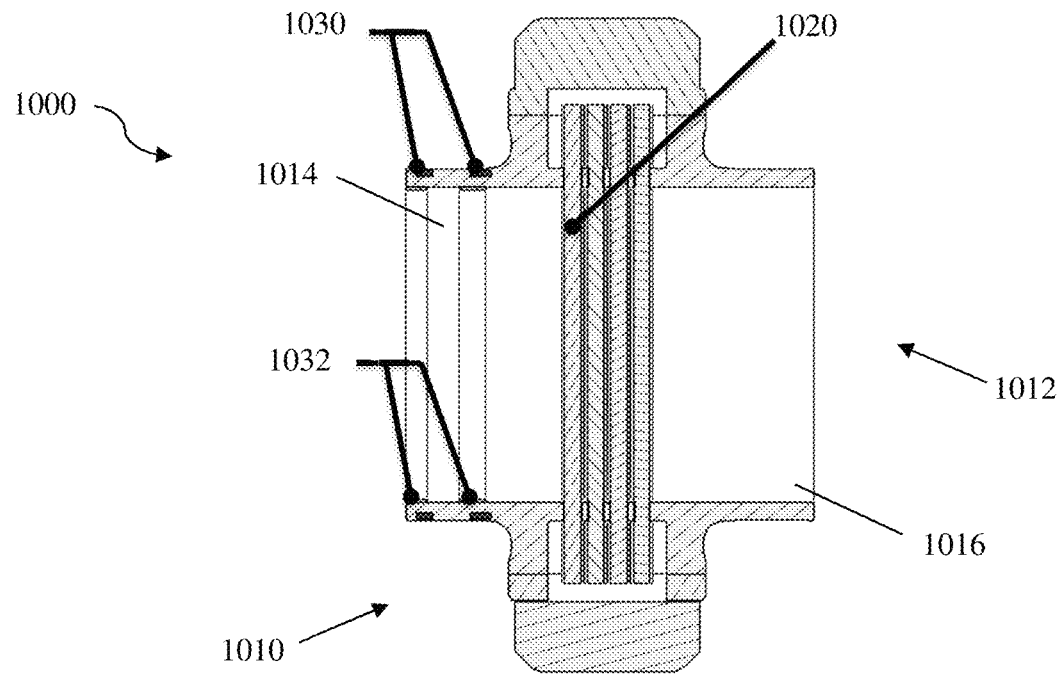
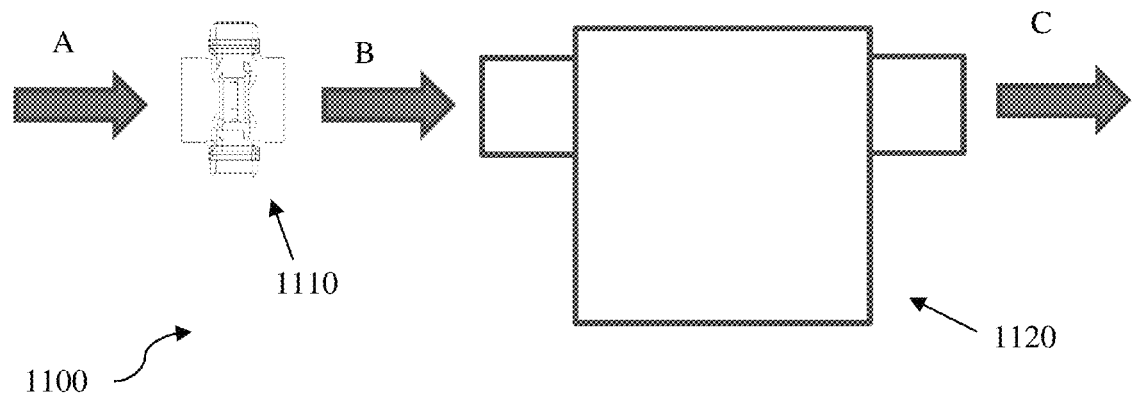

INTAKE PLASMA GENERATOR SYSTEMS AND METHODS

This application is a continuation of and claims the benefit of priority to U.S. patent application Ser. No. 17/198,564 filed on Mar. 11, 2021, which is a continuation of and claims the benefit of priority to U.S. patent application Ser. No. 16/537,319 filed on Aug. 9, 2019, which claims the benefit of priority to U.S. provisional application No. 62/716,531 filed on Aug. 9, 2018. This and all other extrinsic references referenced herein are incorporated by reference in their entirety.

FIELD OF THE INVENTION

The field of the invention is plasma generating systems.

BACKGROUND

The background description includes information that may be useful in understanding the present invention. It is not an admission that any of the information provided herein is prior art or relevant to the presently claimed invention, or that any publication specifically or implicitly referenced is prior art.

Internal combustion engines (ICE) inherently emit pollutants, which is a long standing problem sought to be abated by developments in emissions control technologies, for example industry standard catalysts. However, while catalysts and other emission control technologies have proven effective at abating some pollutant emissions, such technologies cannot operate at all temperatures of the ICE's operation.

Known emission control technologies suffer limited oxidant production ranges due to discharge poisoning, as well as high surface drag on the outer walls of the plasma generator inside the intake stream, where applicable. Moreover, known methods have limited success at mixing constituents of air drawn into the combustion chamber of ICE devices. Further, the known art is generally too technical to allow average consumers to access, assemble, or maintain systems designed to improve efficiencies of ICE devices, or otherwise lack modularity.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

The following description includes information that may be useful in understanding the present invention. It is not an admission that any of the information provided herein is prior art or relevant to the presently claimed invention, or that any publication specifically or implicitly referenced is prior art.

In some embodiments, the numbers expressing quantities of ingredients, properties such as concentration, reaction conditions, and so forth, used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

Thus, there is still a need for improved plasma, radical, and oxidant generator systems and methods to increase combustion efficiency with oxygen and nitrogen radicals and reduce drag in the system.

SUMMARY OF THE INVENTION

The inventive subject matter provides apparatus, systems and methods in which an intake plasma generator has two plasma actuators (e.g., two dielectric barrier discharge (DBD) electrodes) disposed at least partially proximal to an intake stream of an internal combustion engine, for example in the intake stream upstream of the ICE engine. The two DBD electrodes, for example, generate a plurality of oxidants about a reaction zone in the intake stream. The plurality of oxidants treat matter in the intake stream to increase the combustion efficiency of fuel in a cylinder or combustion chamber of the ICE engine downstream of the intake stream.

Generally, the first and second DBD electrodes are tubular and have a tubular wall. However, in some embodiments at least one (preferably both) of the DBD electrodes are plasma actuators deposited on an interior surface of the plasma generator, for example a dielectric surface in the plasma generator (e.g., embedded in dielectric material). In some embodiments, the first and second DBD electrodes generate a hybrid-plasma in the reaction zone, which comprises a glide-arc plasma and a DBD plasma, but additional combinations of plasmas are contemplated, for example nonthermal plasmas (e.g., filamentary plasma, glow plasma, etc), or combinations thereof. In preferred embodiments, the reaction zone is a DBD or nonthermal plasma.

The wall of the DBD electrode can also act as ground electrodes for a first high voltage electrode positioned outside the wall (e.g., first DBD electrode is ground electrode for first high voltage electrode, etc). In some embodiments, an arc-plasma discharge occurs across the wall of the first DBD electrode and the first high voltage electrode, though it is contemplated that nonthermal plasmas, DBD plasmas, glow plasmas, or filamentary plasmas may also be discharged.

Likewise, the wall of the second DBD electrode can be a ground electrode for a second high voltage electrode positioned outside the wall, with arc-plasma discharge occurring across the first and second high voltage electrode (without dielectric material), or a nonthermal plasma discharge across the first and second DBD electrode walls (e.g., with dielectric material), or combinations thereof. In some embodiments, a primary plasma discharge (e.g., nonthermal plasma, DBD plasma, glow plasma, or filamentary plasma, rarely an arc plasma) occurs across the first and second DBD electrode walls, while a secondary plasma discharge occurs across the wall of a third electrode and the wall of either (or both) the first and second DBD electrodes. It is contemplated that the secondary discharge can be of greater voltage than the primary discharge.

Preferably the DBD electrodes (one, two, three, more than five, more than twenty, etc) are arranged in the intake stream to complement the Von Karman Vortex Street fluid instability of matter (e.g., air, air/fuel mix, etc) passing through the intake stream. Viewed from another perspective, the DBD electrodes each have an axis along the length of the generator, and (at least) some of the DBD electrodes are positioned in the intake stream with its axis perpendicular to flow in the intake stream.

A plasma actuator is also contemplated, positioned in the intake stream upstream of the first DBD electrode, such that the plasma actuator charges matter passing through the intake stream, accelerating the charged matter toward the first DBD electrode. In some embodiments, a plasma actuator (or plurality thereof) are arranged upstream, downstream, or within the reaction zone of a plasma generator of the inventive subject matter. Plasma actuators of the inventive subject matter can create DBD plasma, glow plasma, or filamentary plasma. Viewed from another perspective, some plasma actuators are also DBD electrodes. For example, plasma actuators can be embedded in inner surfaces (e.g., exposed to interior of plasma generator, exposed to intake stream, exposed to air in intake stream, etc) of the plasma generator as points, or as irregular (e.g., random) or regular (e.g., uniform, repeated, geometric, etc) patterns. In some embodiments, a plasma actuator, more preferably a plurality thereof, are used without the addition of DBD electrodes.

The inventive subject matter contemplates a nonthermal dielectric barrier discharge plasma generates radical oxidants in air in the intake stream of an ICE engine, which enhances combustion of fuel inside the cylinder or combustion chamber of the engine. This promotes increased efficiency, higher power, and lower emissions. The inventive subject matter advantageously lowers emissions during cold-start conditions, which is critical as it appears no known emissions control technology works at temperatures below light-off temperature of the exhaust catalysts.

The inventive subject matter further contemplates a nonthermal dielectric barrier discharge plasma favorably generates thrust on the surrounding air by accelerating electrons and positive ions in the intake stream of an ICE engine, which entrain neutral air molecules. This further promotes increase efficiency, higher power, and lower emissions.

Various objects, features, aspects and advantages of the inventive subject matter will become more apparent from the following detailed description of preferred embodiments, along with the accompanying drawing figures in which like numerals represent like components.

The following definitions are useful in the technical field of the inventive subject matter:

DBD: Dielectric Barrier Discharge with filamentary or glow type plasma which is in a non-equilibrium state between the temperatures of the electrons vs the ions/gas/neutrals.

Arc Discharge: Arc plasma discharge which is close to an equilibrium state between the temperatures of the electrons vs the ions/gas/neutrals.

Hybrid Plasma: two or more different type of plasmas within the same reaction zone or in close proximity to each other.

Radical: Oxidant.

O3: Ozone.

NO: Nitrogen Monoxide.

NO2: Nitrogen Dioxide.

DOC: Diesel Oxidation Catalyst.

DPF: Diesel Particulate Filter.

Electrical Feedthrough: Electrode which includes an insulator and mounting mechanism.

Coanda Effect: Entrained flow that attaches to a surface within the flow.

Discharge Poisoning: When too much energy is supplied to the plasma generator and the oxidant production reduces due to too much heat.

Plasma Actuator: Plasma generator that accelerates charged air species.

Internal Combustion Engine (ICE): all combustion engines including reciprocating, rotary, turbine, jet, and rocket engines.

Intake Cowl: where are enters the compression stage of a jet turbine.

Cold Start: When an engine is started from ambient/environmental temperatures.

BRIEF DESCRIPTION OF THE DRAWINGS

FIG. 1 depicts a cross section view of an electrode of the inventive subject matter.

FIGS. 2A-2C depict the flow of matter around electrodes of the inventive subject matter.

FIG. 6 depicts discharges between electrodes of the inventive subject matter.

FIG. 7 depicts another electrode of the inventive subject matter.

FIG. 8 depicts another array of electrodes of the inventive subject matter.

FIG. 9 depicts a further array of electrodes of the inventive subject matter.

FIG. 10 depicts another intake plasma generator of the inventive subject matter.

FIG. 11 depicts a schematic of a system of the inventive subject matter.

DETAILED DESCRIPTION

Figure 3:
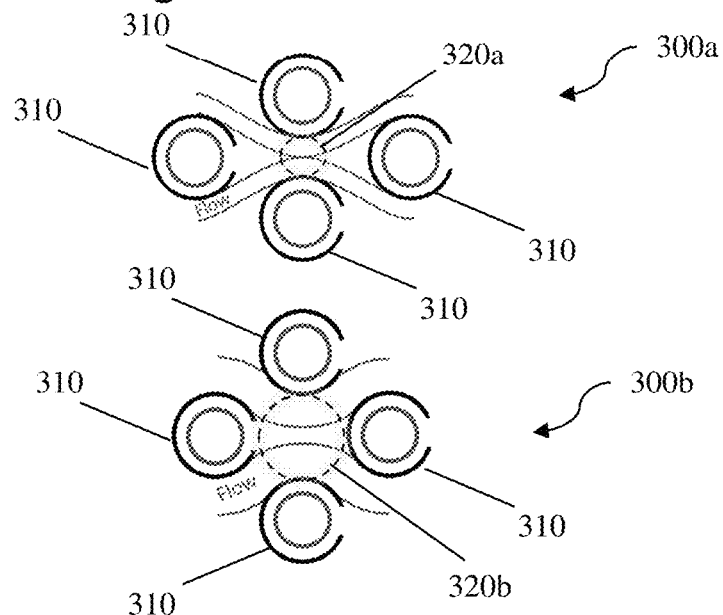
FIG. 3 is a cross sectional view of arrays of electrodes in an intake plasma generator of the inventive subject matter.

Methods, systems, and devices of the inventive subject matter use concentric cylindrical chambers to enhance mixing inside the center of the intake stream of an ICE engine. Surface features on insulator (e.g., dielectric material, etc) and electrode surfaces are employed to increase mixing of air in the intake stream, increasing generation of oxidants in the intake stream. Patterned arrays of electrodes in the intake stream (e.g., on the interior walls of the plasma generator, interior and exterior walls of concentric cylindrical chamber, etc) to maximize the amount of plasma inside a given area (e.g. reaction zone) inside the plasma generator. High voltage electric fields are also used to impart thrust on the intake air stream with precise flow vectoring. Blind mate connectors and other user-friendly connectors are used between components (e.g., between power module and electrodes, etc) to make embodiments of the inventive subject matter easy to use, user-friendly, and safe to assemble and maintain.

In preferred embodiments, components of the devices are self-grounded, shielding at least some (preferably all) of the high voltage wiring and connections from external systems, making it safe to touch the plasma generator while in operation. The plasma generator is preferably further shielded from electrical interference with external electrical, control, or communication systems. For example, in some embodiments at least some (preferably all) high voltage components are attached to the plasma generator (e.g., reactor) housing and shielded. In some embodiments, multiple modular power supplies are used that work together to power isolated electrode sets (e.g., 1:1, 1:2, 1:3, 1:4, 1:5, 1:10, or 1:20 ratio of modular power supply to electrode set, etc), such that if one modular power supply paired electrode set fails, other modular power supplies and paired electrodes sets are available to operate as back-ups. In some embodiments, such modular power supply and paired electrode sets can operate at power or voltage greater than normal operation to compensate for failed power and electrode pairs, for example 110%, 120%, 130%, 140%, 150%, 200%, or greater than normal operating parameters. Defective power supplies, power supply controllers, or electrode inserts can likewise be removed and replaced without affecting the performance of other power delivery modules, power controllers, or electrode inserts of the plasma generator.

The plasma generator (e.g., reactor) is preferably located in the intake stream of an ICE engine, upstream of the exhaust gas recirculation ("EGR") to eliminate potential contamination of insulators and other plasma generator components, for example by water vapor and particulate matter (e.g., soot). Moreover, insulators in the reactor/plasma generator preferably have a glazed top-coat to make them at least semipermeable, preferably impermeable, to constituents of the exhaust gas or any other liquids, gases, and or particulate matter inside the air intake of an ICE engine. In some embodiments, sensors detect pressure differentials (or voltage feedback, or both) in the plasma or intake stream inside the plasma generator, and the power supply controller changes the discharge of electrodes in the plasma generator to compensate for the pressure differentials (or voltage feedback, or both).

FIG. 1 is a cross section view of an electrode of the inventive subject matter. FIG. 1 depicts mid-tube cross section 100, having inner conductor 110 and dielectric layer 120. Inner conductor 110 is preferably made at least partially (more preferably wholly) of stainless steel, nickel, titanium, copper, tungsten, or aluminum, or combinations thereof. Dielectric layer 120 is preferably made at least partially of quartz, a ceramic (e.g., alumina ceramic), mica, barium titanate, strontium titanate, conjugated polymers, calcium copper titanate, or combinations thereof, and preferably non-porous. In preferred embodiments, inner conductor 110 has a diameter of about 1 mm, though diameters of 0.5 mm, 2 mm, 3 mm, and 5 mm are also contemplated. Likewise, dielectric layer 120 preferably has a diameter measured from the outer wall of the dielectric layer of about 5 mm, and always greater than the diameter of inner conductor 110.

FIG. 2a depicts the flow of matter (e.g., air) around electrode 210a of the inventive subject matter in an intake stream of an ICE engine. Immediately downstream of electrode 210a is separation point 220a, where matter (e.g., air) flowing from left to right over electrode 210a separates from the electrode. Downstream of separation point 220a is wake region 230a, which depicts the turbulence in the matter flow downstream of the electrode. In this embodiment, matter in wake region 230a is highly turbulent, with increased drag of the flow of matter over the electrode and asymmetric mixing dynamics. The shape and surface contours of electrode 220a, as well as the spacing and arrangement of other electrodes, can be adjusted to increase or decrease drag, as well as introduce asymmetric mixing dynamics, symmetrical mixing dynamics, or no mixing dynamics downstream of the electrode.

FIG. 2b depicts the flow of matter (e.g., air) around electrode 210b of the inventive subject matter in an intake stream for an ICE engine, with the flow of matter exhibiting reduced drag compared to FIG. 2a and symmetrical mixing dynamics in wake region 230b, with a reduced separation point 220b as compared to FIG. 2a and separation point 220a.

FIG. 2c depicts the flow of matter (e.g., air) around electrode 210c of the inventive subject matter in an intake stream for an ICE engine, with the flow of matter exhibiting reduced with reduced drag compared to FIG. 2b and no mixing dynamics in wake region 230c, with a further reduced separation point 220c compared to FIG. 2b.

FIG. 3 is a cross sectional view of arrays 300a and 300b of electrodes 310 in an intake plasma generator of the inventive subject matter, with each array exhibiting different flow dynamics. Tube cross sectional flow areas 320a and 320b are adjusted to determine flow characteristics (backpressure, flow velocity, dynamic geometry, vortex shedding frequency) on matter (e.g., gas, liquid, solid, plasma, combination thereof) flow through the arrays, both inside and outside the tubes of each electrode. For example, cross sectional flow area 320a is smaller than cross section flow area 320b, producing a more constrained flow of matter through the array.

Figure 4:
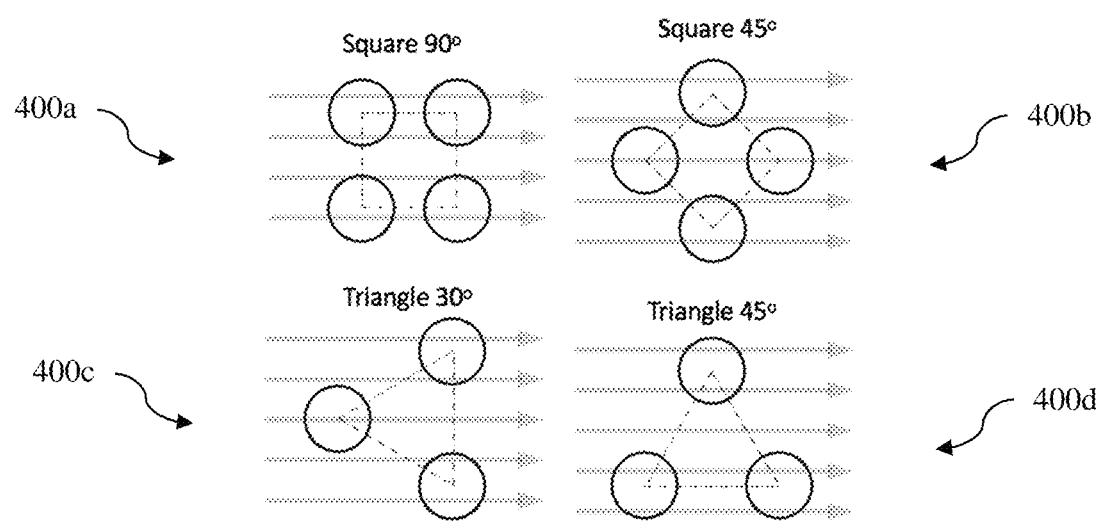
FIG. 4 depicts other arrays of electrodes in an intake plasma generator of the inventive subject matter.

FIG. 4 depicts an arrays 400a, 400b, 400c, and 400d of electrodes in an intake plasma generator of the inventive subject matter, with each array having a different flow dynamic. Here, array 400a is in a square 90° configuration, array 400b is in a square 45° configuration, array 400c is in a triangle 30° configuration, and array 400d is in a triangle 45° configuration. Tube (electrode) array configurations can either enhance or diminish mixing and drag depending on the tubes' correlating positions with respect to their neighboring tubes.

Figure 5A:
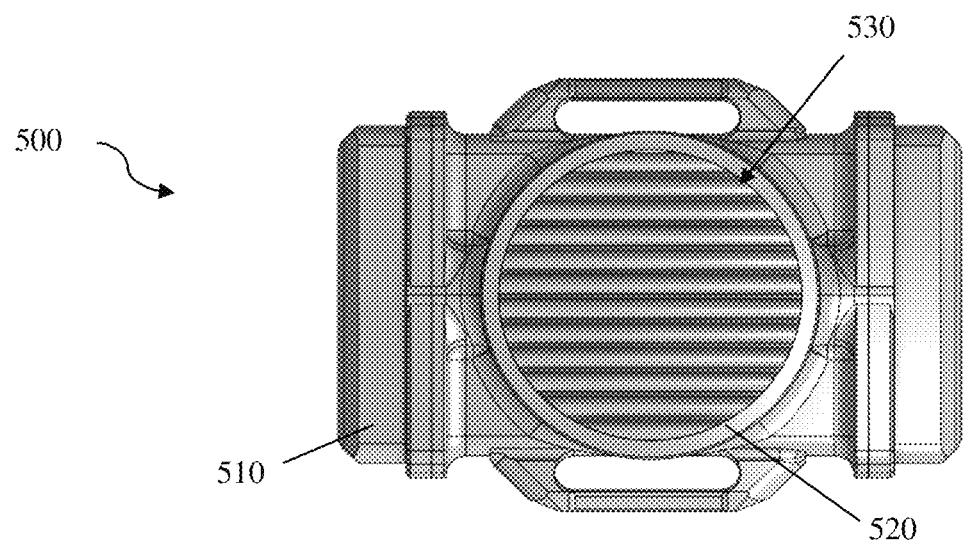
FIGS. 5A-5B depict an intake plasma generator of the inventive subject matter.
Figure 5B:
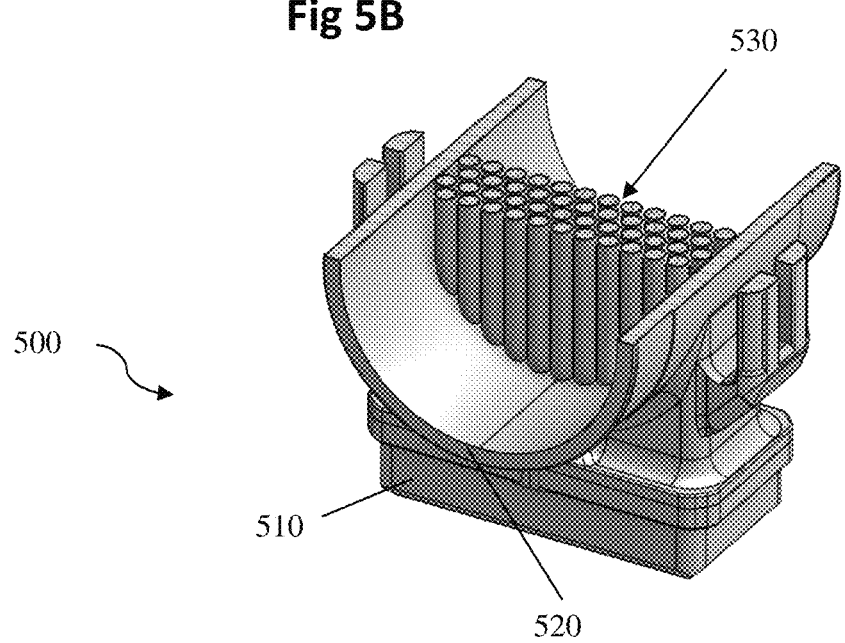

FIG. 5A depicts a front view of an array of electrodes (tubes) 530 in intake plasma generator 500 of the inventive subject matter, arranged with the axis of each tube perpendicular to a flow of matter (e.g., air) in the intake stream. Plasma generator 500 includes housing 510 with rim 520 that provides flow to the array of electrodes 530, which are disposed within the intake stream of intake plasma generator 500. FIG. 5B depicts a further depiction of plasma generator 500, with cross section and angled view of intake plasma generator 500 from FIG. 5A.

FIG. 6 depicts DBD discharges 630 between outer dielectric layer surfaces 610 of each respective electrode (tube) 620 of intake plasma generator 600 of the inventive subject matter. DBD discharges 630 create oxidants in the flow of matter (e.g., air) through the intake plasma generator.

FIG. 7 depicts electrode 700, which is another embodiment used in intake plasma generators of the inventive subject matter. Electrode 700 includes secondary high voltage electrode 710 surrounding outer dielectric layer 722 of electrode (tube) 720. Secondary high voltage electrode 710 also includes upstream perforation 712 and downstream perforation 714, which permits matter (air) in the intake stream to flow through the perforations, exposing such matter to plasma discharge 730 (e.g., typically nonthermal plasma, DBD, or hybrid plasma, preferably DBD, filamentary, or glow plasma) between dielectric layer 722 and secondary high voltage electrode 710.

FIG. 8 depicts array 800 of electrodes (tubes) 700a and 700b, each surrounded by a secondary high voltage electrode (perforated) as depicted in FIG. 7. In this arrangement, in addition to arc-plasma discharge (or DBD, or hybrid plasma, or filamentary, or glow plasma) between the dielectric layer and the secondary high voltage electrode of each pair, arc-plasma discharge (or DBD, or hybrid plasma) 810 occurs between the perforated secondary high voltage electrodes of each pair.

FIG. 9 depicts 900 array of electrodes (tubes) 910 with primary and secondary plasma discharges 920 and 922 (e.g., non-thermal plasma, filamentary plasma, glow plasma, DBD plasma, etc) occurring between each generator 910 in one embodiment of an intake plasma generator of the inventive subject matter with flow of matter (e.g., air) in the direction of arrow A. Industry standard plasma reformers have a single discharge that operates at one voltage. If more oxidants need to be generated, there is a limited range of increase of oxidants by simply adding more power, for example due to waste heat that reduces oxidant production efficiency. However, the inventive subject matter contemplates multiple discharge points (e.g., primary discharge 920 and secondary discharge 922, etc) that operate at higher voltages (e.g., secondary discharge higher voltage (e.g. more than 30 kv, 40 kv, 50 kv, or 60 kv, etc) than primary discharge (e.g., less than 30 kv, 20 kv, 10 kv, 5 kv, etc)) when more oxidants need to be produced.

FIG. 10 depicts an alternative embodiment of an intake plasma generator comprising the electrode arrays of the inventive subject matter, and further including plasma actuators (comprising actuator outer electrodes and actuator inner electrodes) positioned upstream of the electrode array (patterned tubes). Plasma generator 1000 includes housing 1010 with flow channel 1012 for receiving a flow of air in the intake of an ICE engine, through upstream opening 1014 past actuator inner electrodes 1032, through electrode array (patterned tubes) 1020 and out downstream opening 1016. High voltage AC and/or DC is applied between the surface of tubes in electrode array 1020 and plasma actuator electrodes 1030 and 1032 to entrain the gas flow to become more coherent. This effect is helpful for reducing frontal drag on the tubes. Actuator outer electrodes 1030 are positioned circumferentially on the outside of the upstream opening 1014 and are submerged in a dielectric substance to sequester a plasma discharge. Actuator inner electrodes 1032 are positioned circumferentially on the inside surface of upstream opening 1014, and generate plasma on edges of the electrodes to impart momentum on air flow, effectively reducing frontal drag on tube array 1020. Tube array 1020 is arranged inside the air stream of plasma generator 1000 to generate oxidants and mix them with the bulk air flow.

FIG. 11 depicts a schematic of system 1100 of the inventive subject matter, including intake plasma generator 1110 operating in the intake stream of ICE 1120. Air flows in the direction of arrow A into and through intake plasma generator 1110. Intake plasma generator 1110 mixes the air, increases thrust/flow of the air, and produces a consistent distribution of oxidants in the air flow. The air flow containing oxidants exits generator 1110 at arrow B, and flows into ICE 1120 (e.g., through intake manifold into cylinder). The air flow containing oxidants improves the combustion characteristics of ICE 1120, with exhaust exiting at arrow C. System 1100 increases efficiency, increases power, and lowers emissions of ICE 1120 compared to systems that operate without generator 1110.

Figure 12:
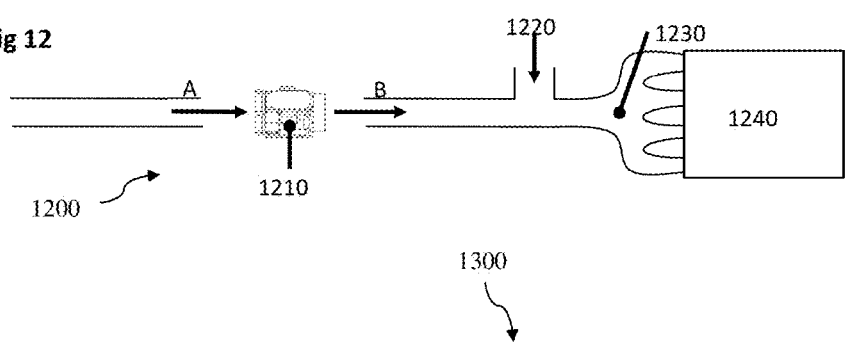
FIG. 12 depicts a schematic of another system of the inventive subject matter.

FIG. 12 depicts a schematic of system 1200 of the inventive subject matter, including plasma generator 1210 operating in the intake stream A of ICE 1240. Air flow in the direction of arrow A flows into and through plasma generator 1210. Plasma generator 1210 mixes the air, increases thrust/flow of the air, and uses plasma to produce a consistent distribution of oxidants in the air flow. The air flow containing oxidants exits generator 1210 at arrow B and flows into plenum/manifold 1230, which further distributes the flow into ICE 1240 (e.g., into cylinder). The air flow containing oxidants at arrow B improves the combustion characteristics of ICE 1240. It should also be noted that generator 1210 is positioned upstream of EGR 1220, which avoids contaminating generator 1210 with moisture, particulate matter (e.g., soot) or other contaminates from EGR 1220 that are recirculated into ICE 1240. System 1200 increases efficiency, increases power, and lowers emissions of ICE 1240 compared to systems that operate without generator 1210.

Figure 13:
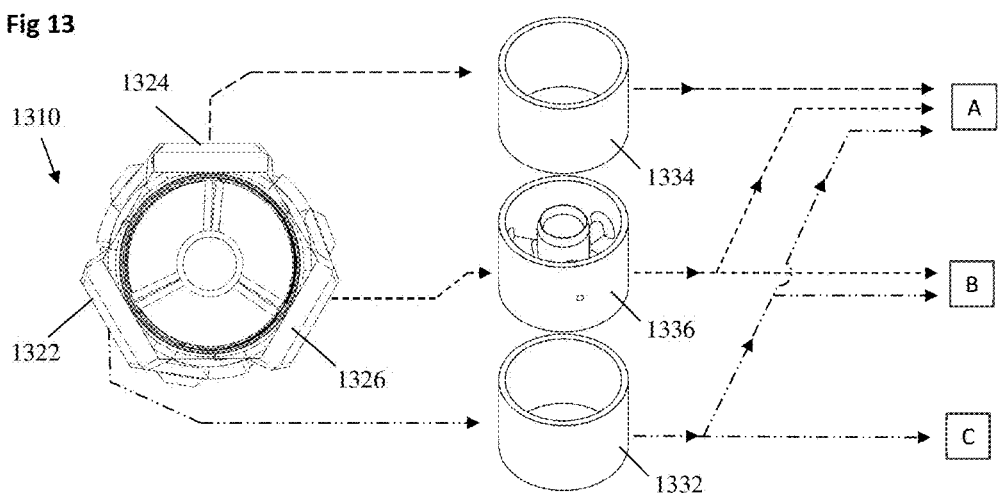
FIG. 13 depicts a schematic of the operation of a plasma generator of the inventive subject matter.

FIG. 13 depicts schematic 1300 of the operation of plasma generator 1310 of the inventive subject matter. Plasma generator 1310 includes power delivery modules 1322, 1324, and 1326, which are each independently electrically coupled to insulated electrode arrays 1332, 1334, and 1336, respectively, within plasma generator 1310. Power delivery modules 1322, 1324, and 1326 each separately drive insulated electrode arrays 1332, 1334, and 1336 during stages A, B, and C of an ICE engine operation, as depicted by the large-dash, short-dash, and dot-dash lines in the schematic.

Stage A is the cold start of an ICE engine. During stage A, each of power delivery modules 1322, 1324, and 1326 powers insulated electrode arrays 1332, 1334, and 1336 to generate plasma (e.g., DBD, arc, hybrid, etc), preferably DBD, in the airflow. This increases thrust of airflow through plasma generator 1310 and into an ICE engine (e.g., cylinder of the engine), introduces oxidants and other radicals into the air flow, and mixes the air flow to produce a consistent blend of oxidants and radicals. The increased thrust and oxidant/radical blend significantly increases the power and efficiency of an ICE engine at cold start, as well as substantially reduces the pollutant emissions of the engine, as the catalyst for emission reduction in the engine does not function sufficiently, or optimally, until a thermal equilibrium of the ICE engine is reached.

Stage B is the post-cold start stage of an ICE engine operation, as the engine approaches thermal equilibrium. During stage B, each of power delivery modules 1322 and 1326 powers insulated electrode arrays 1332 and 1336 to generate plasma (e.g., DBD, arc, hybrid, etc), preferably DBD, in the airflow. This again increases thrust and oxidant/radical presence in the airflow, which increases the power and efficiency of an ICE engine, as well as substantially reduces harmful emissions. Stage C is the post-thermal equilibrium stage of an ICE engine operation, where the engine has reached a thermal equilibrium. At this stage, only power delivery module 1322 delivers power to insulator electrode array 1332 to generate plasma, which increases thrust and oxidant/radical presence in the airflow.

Figure 14A:
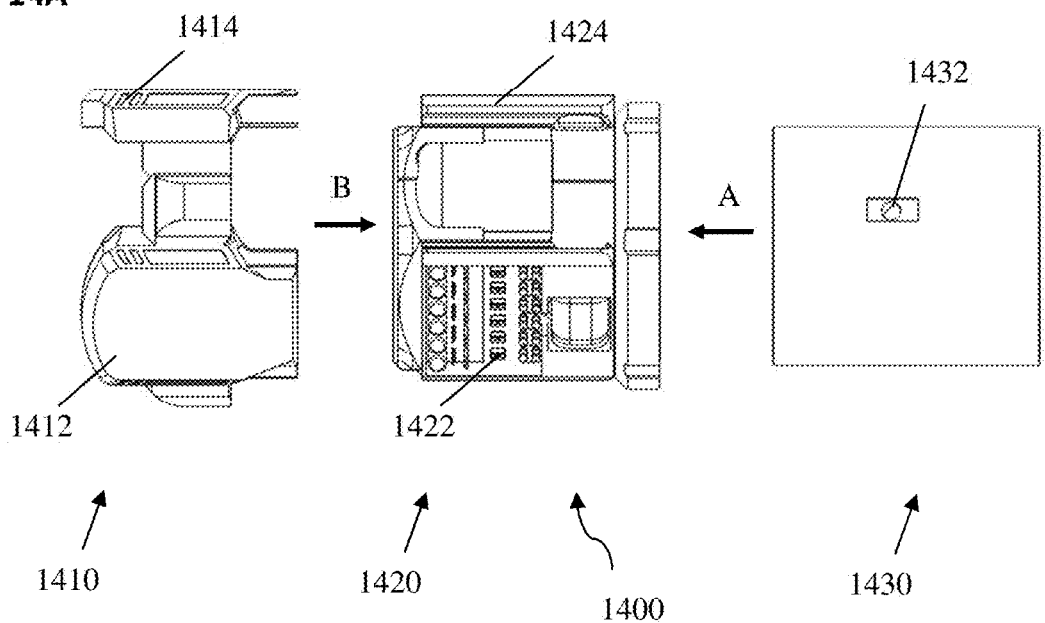
FIGS. 14A-14C depict yet another plasma generator of the inventive subject matter.

FIG. 14A depicts an exploded view of plasma generator 1400 of the inventive subject matter, including power supply housing 1410, reactor body 1420, and insulator electrode insert 1430. In combined form, insulator electrode insert 1430 nests within reactor body 1420 (arrow A), and power supply housing 1410 nests over reactor body 1420 (arrow B). Power supply housing 1410 includes power delivery modules 1412, 1414, and (not pictured) 1416. Reactor body 1420 includes reactor circuitry 1422, 1424, and (not pictured) 1426, which couples with each of power delivery modules 1412, 1414, and 1416 when generator 1400 is in operable form. Insulator electrode insert 1430 includes nested insulated electrode arrays 1432, 1434, and 1436 (not pictured), for example of the fashion disclosed in FIG. 13. Each of insulated electrode arrays 1432, 1434, and 1436 electrically couples to reactor circuitry 1422, 1424, and 1426, respectively, for example via electrical feedthrough port 1432, and is powered by power delivery modules 1412, 1414, and 1416, respectively, when generator 1400 is in operable form.

Figure 14B:
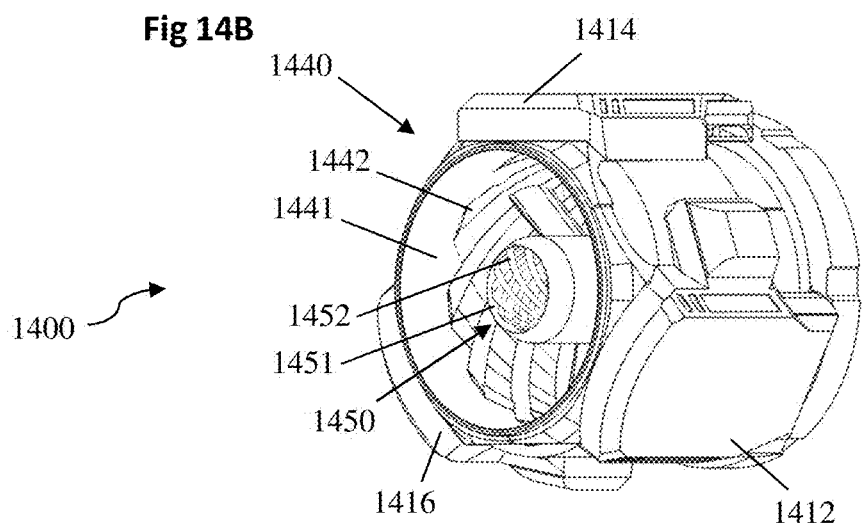

FIG. 14B depicts the operable form of plasma generator 1400 of the inventive subject matter. Power delivery modules 1412, 1414, and 1416 are arranged about the exterior of generator 1400. The reactor chamber of generator 1400 includes outer cylinder 1440 and inner cylinder 1450. Outer cylinder 1440 includes electrode pattern 1442 arranged along dielectric material 1441 on the inner surface of outer cylinder 1440. Inner cylinder is positioned approximately in the center of outer cylinder 1440, and includes electrode pattern 1452 arranged along dielectric material 1451 on the inner surface of inner cylinder 1450.

Figure 14C:
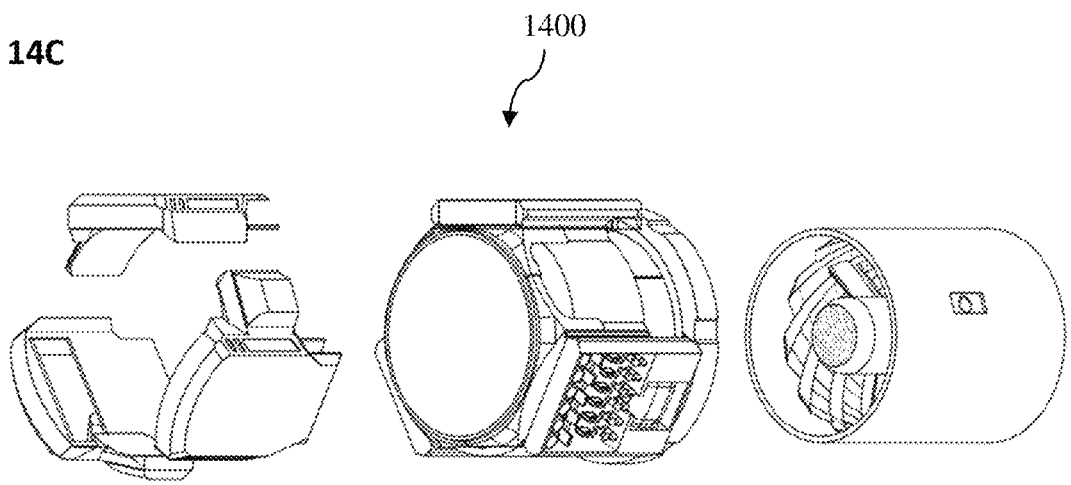

FIG. 14C further depicts a side angle exploded view of plasma generator 1400.

Figure 14D:
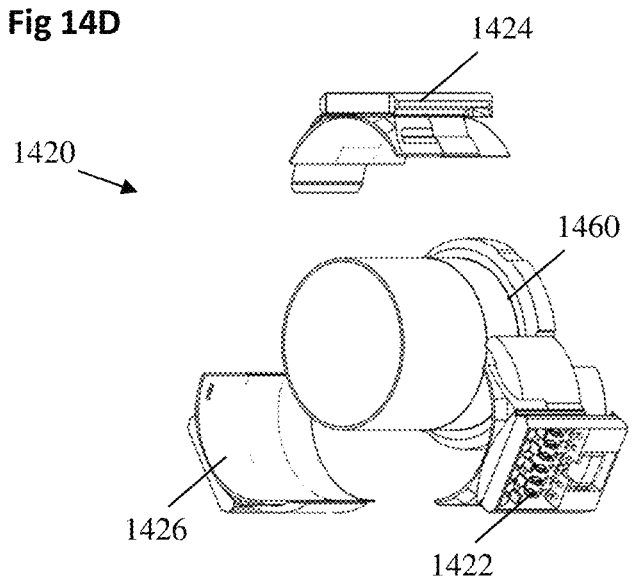
FIG. 14D depicts a component of a plasma generator of the inventive subject matter.

FIG. 14D further depicts a side angle exploded view of reactor body 1420, including reactor circuitry 1422, 1424, and 1426 arranged about reactor housing 1460.

Figure 14E:
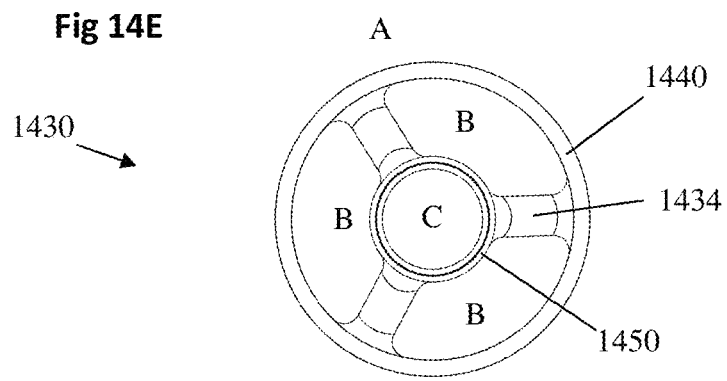
FIG. 14E depicts another component of a plasma generator of the inventive subject matter.

FIG. 14E further depicts an axial view of insulator electrode insert 1430, having outer cylinder 1440 (which includes electrode patterns on dielectric material of the cylinder wall) and inner cylinder 1450 positioned substantially in the center of outer cylinder 1450 (again with electrode patterns on the dielectric material of the interior and exterior cylinder walls). Inner cylinder 1450 is positioned within outer cylinder 1440 by support columns 1434, which include electrical feedthrough ports 1432 (not pictured). In operation, insulator electrode insert generates DBD, with a charge distribution of the electrodes of negative charge in region A, positive charge in region B, and negative charge in region C.

Figure 15A:
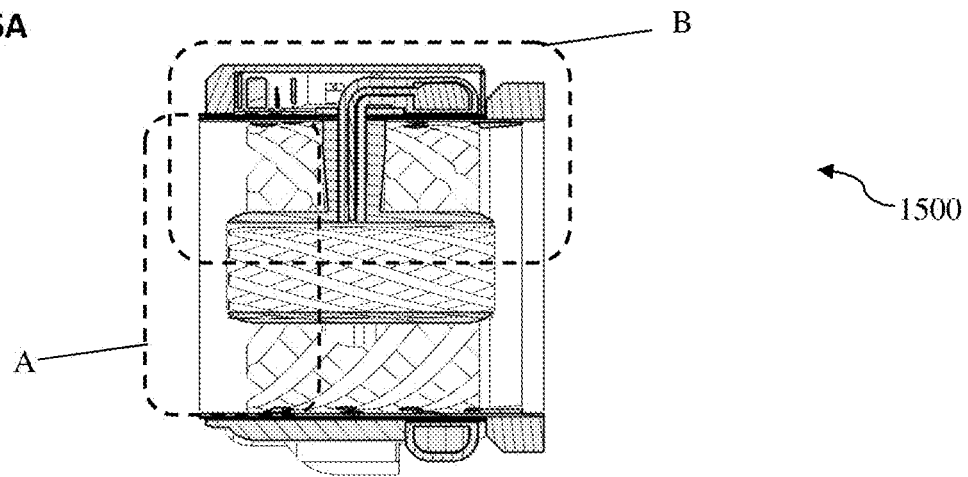
FIG. 15A depicts still another plasma generator of the inventive subject matter.
Figure 15B:
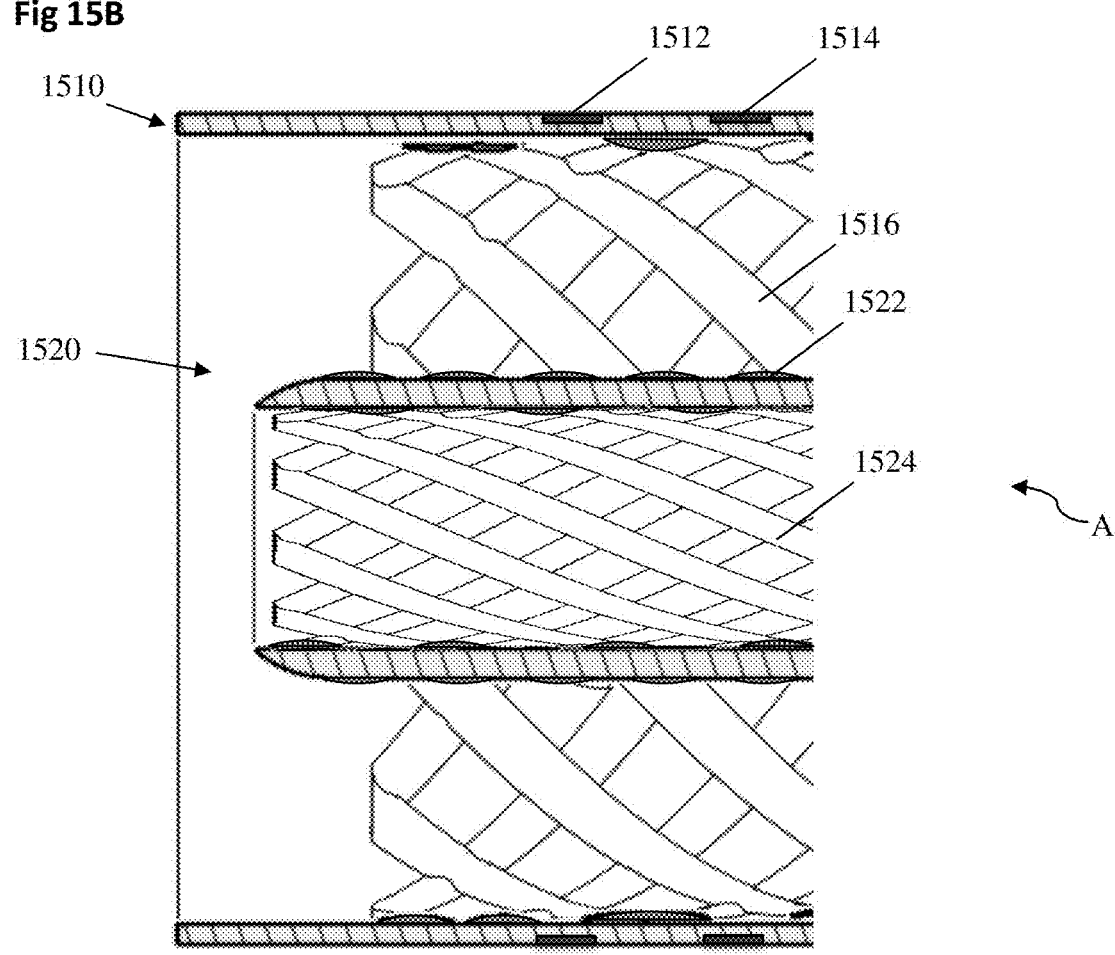
FIG. 15B depicts a portion of a plasma generator of the inventive subject matter.

FIG. 15A depicts a side cross section view of plasma generator 1500 of the inventive subject matter. FIG. 15B depicts a closeup of region A of plasma generator 1500, while FIG. 15C depicts a closeup of region B of plasma generator 1500.

FIG. 15B depicts a closeup of region A of plasma generator 1500, including outer cylinder 1510 and inner cylinder 1520. The walls of outer cylinder 1510 and inner cylinder 1520 are made substantially of dielectric material (e.g., quartz, alumina ceramic, mica, barium titanate, strontium titanate, conjugated polymers, calcium copper titanate, etc). Actuator outer electrodes 1512 and 1514 are disposed about the outer circumference of outer cylinder 1510, and embedded in dielectric material to sequester a plasma discharge. Exposed electrode pattern 1516 is disposed along the inner circumference of outer cylinder 1510, and is used to generate a plasma (e.g., DBD, arc, hybrid, preferably DBD) at the edges of electrode pattern 1516, and in turn generate oxidants and other radicals while imparting momentum on air flow through the outer cylinder, effectively reducing drag on the inner walls of the cylinder. Inner cylinder 1520 also includes electrode pattern 1522 along the outer circumference of inner cylinder 1520, and electrode pattern 1524 along the inner circumference of inner cylinder 1520. Electrode patterns 1522 and 1524 are likewise used to generate a plasma (e.g., DBD, arc, hybrid, preferably DBD) at the edges of the electrode patterns, in turn generating oxidants and other radicals while imparting momentum on air flow through the outer and inner cylinders.

Figure 15C:
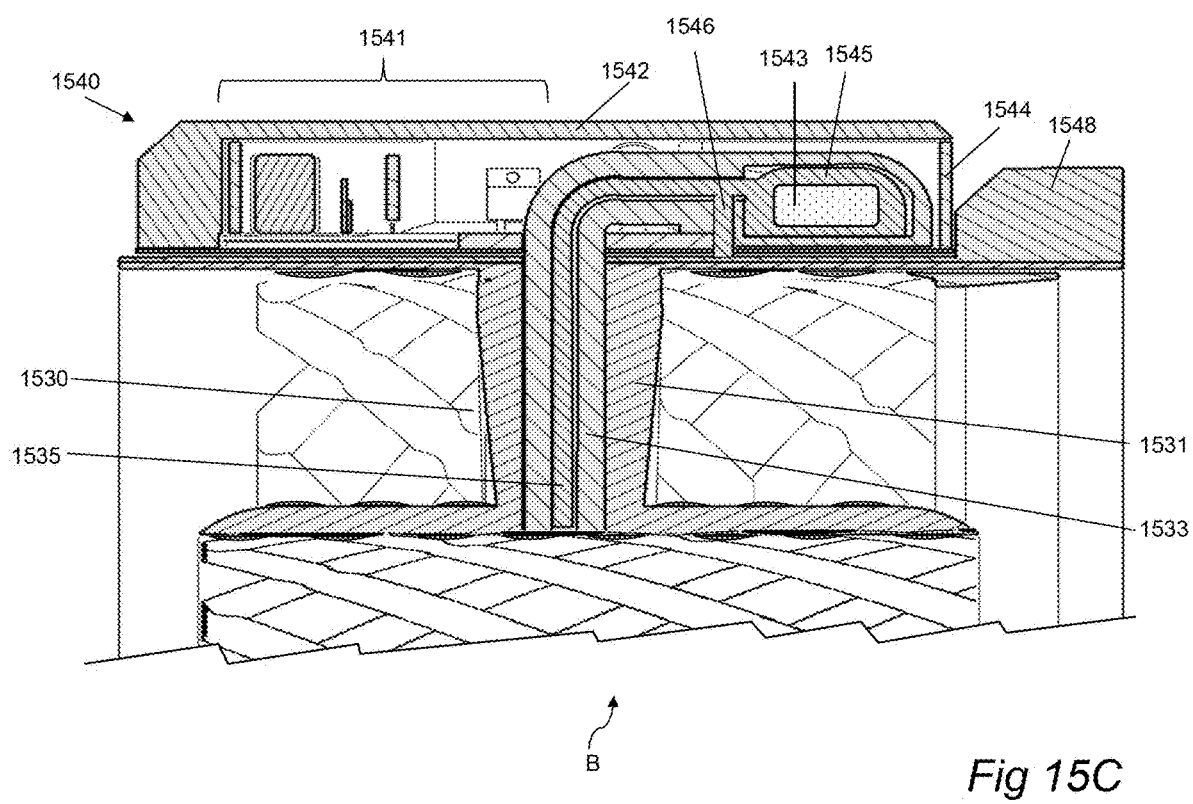
FIG. 15C depicts another portion of a plasma generator of the inventive subject matter.

FIG. 15C depicts a closeup of region B of plasma generator 1500, including support column 1530 and reactor control 1540. Wall 1531 of support column 1530 is made substantially of dielectric material (e.g., ceramic, alumina ceramic, quartz, mica, barium titanate, strontium titanate, conjugated polymers, calcium copper titanate, etc) and couples to the inner and outer cylinders. Support column 1533 further includes high voltage insulation 1533 (e.g., made of teflon, ceramic, quartz, silicon, combinations thereof, etc) about ground wire 1535. Reactor control 1540 includes plasma power supply circuit components 1541, which control the generation of plasma at the electrodes. Reactor control 1540 further includes ground wire 1546, which further couples to reactor housing 1548 (along with ground wire 1535). Reactor control 1540 further includes high voltage transformer core 1543 and high voltage transformer secondary coil 1545. Circuit housing 1544 and circuit housing cover 1542 further enclose reactor control 1540. It should be appreciated from FIG. 15C that the components of plasma generator 1500 are self-grounded.

Figure 16A:
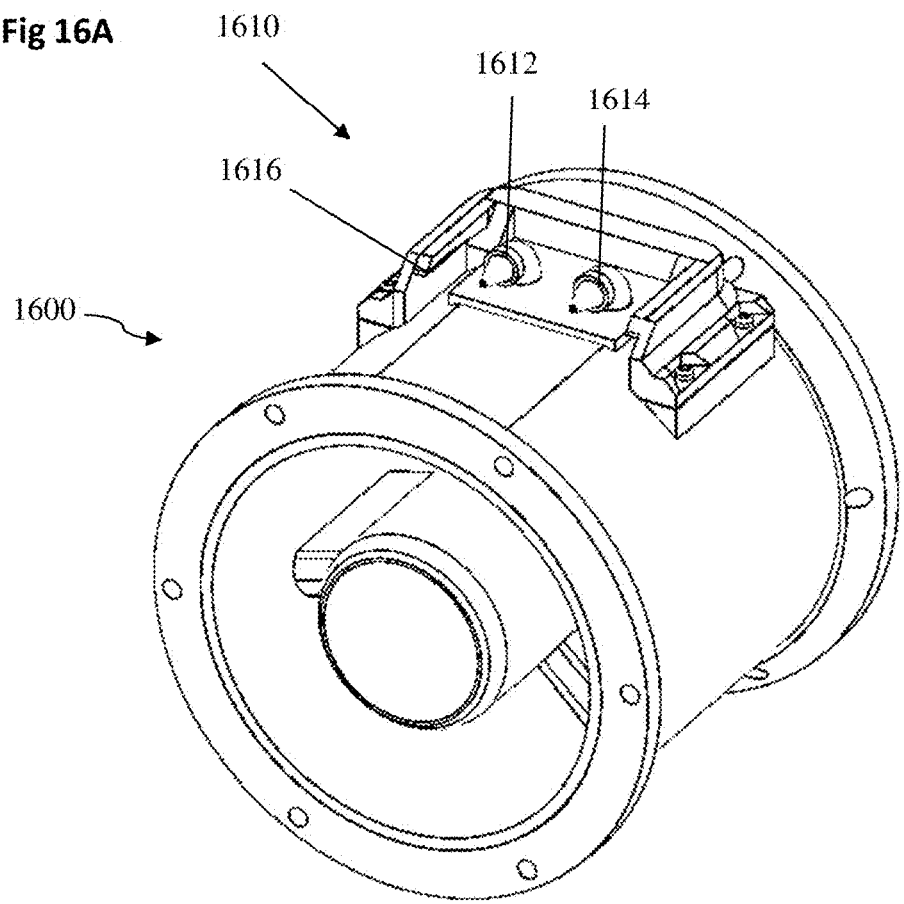
FIGS. 16A-C depict yet further components of a plasma generator of the inventive subject matter.

FIG. 16A depicts power coupling 1610 of reactor housing 1600 of a plasma generator of the inventive subject matter. Power coupling 1610 includes male blind-mate connectors 1612 and 1614, which are tapered and high voltage. Power coupling 1610 further includes blind-mate tapered slide connectors 1616, which are designed to mate with a complementary tapered slide connector of a power delivery module to guide and couple the power delivery module to power coupling 1610.

Figure 16B:
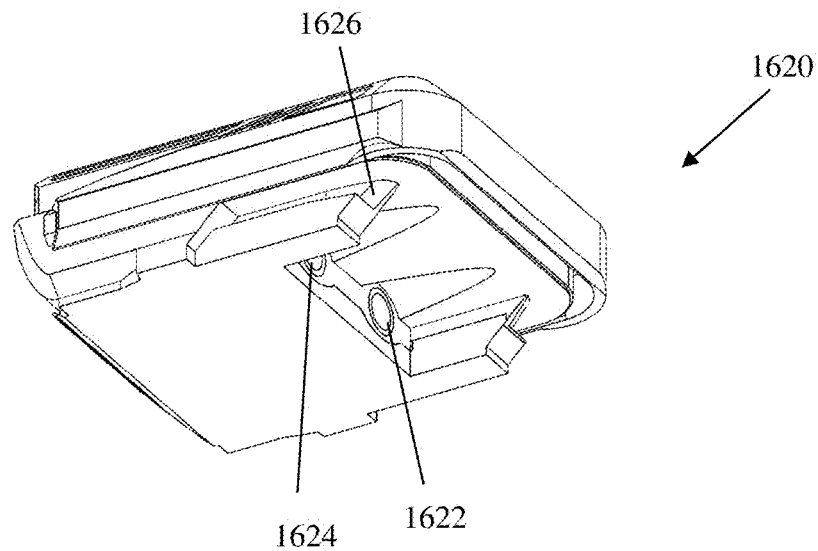

FIG. 16B depicts power delivery module 1620 of a plasma generator of the inventive subject matter. Power delivery module 1620 includes female blind-mate connectors 1622 and 1624, which are tapered and high voltage. Female connectors 1622 and 1624 are sized and dimensioned to complement male connectors 1612 and 1614 to electrically couple power delivery module 1620 to power coupling 1610. Power delivery module 1620 further includes blind-mate tapered slide connectors 1626, which are designed to mate with complementary tapered slide connector 1616 of a power coupling 1610 to guide and couple power delivery module 1620 to power coupling 1610.

Figure 16C:
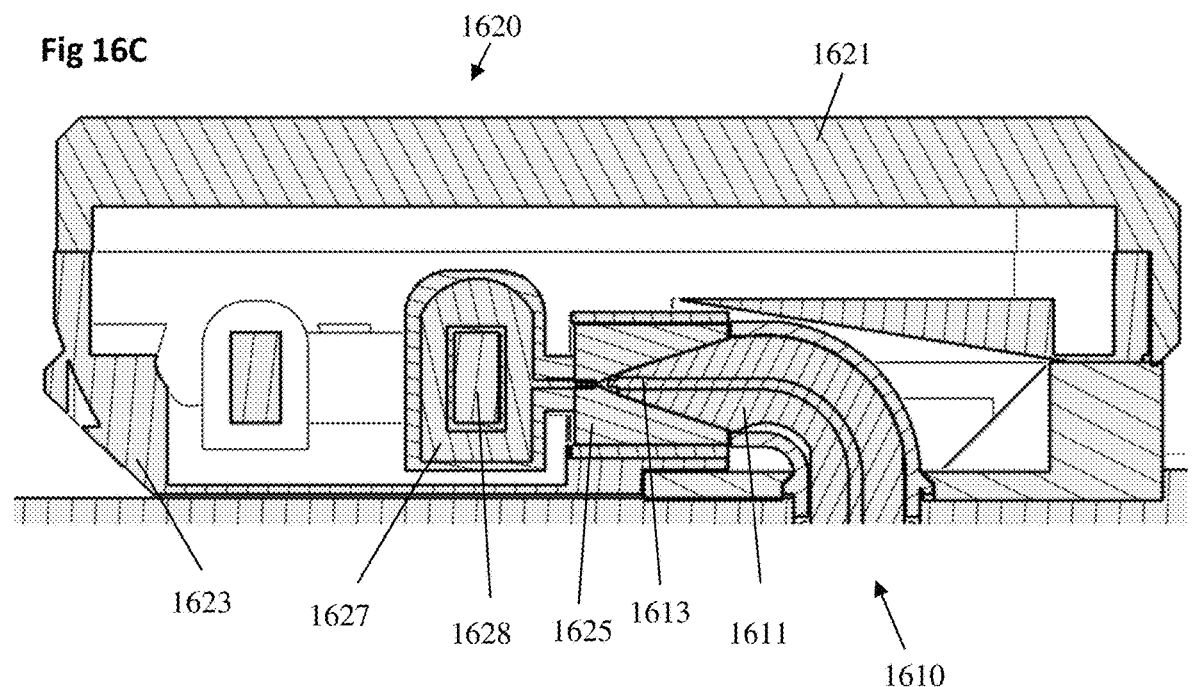

FIG. 16C depicts a cross section view of power delivery module 1620 coupled with coupling 1610 of reactor housing 1600. Male connectors 1612 (and 1614) include ceramic cover 1611 and conductor 1613. Male connector 1612 couples with ceramic cover 1625 of power delivery module 1620, bringing conductor 1613 into contact with a conductor of female connector 1622. Power delivery module further includes high voltage transformer core 1628 which is at least partially surrounded by high voltage transformer primary coil 1627. Top housing cover 1621 and base housing cover 1623 enclose the contents of power delivery module 1620.

Figure 17:
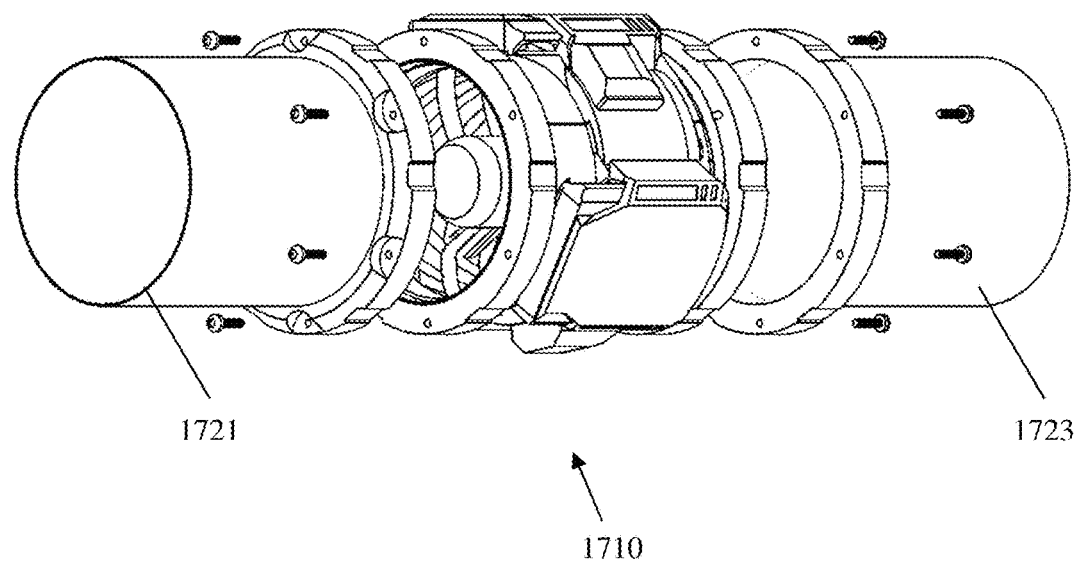
FIG. 17 depicts a plasma generator of the inventive subject matter incorporated into an air intake component.

FIG. 17 depicts an exploded view of an embodiment of the inventive subject matter where plasma generator 1710 is coupled to an existing air intake system including air intake tubes 1721 and 1723.

Figure 18:
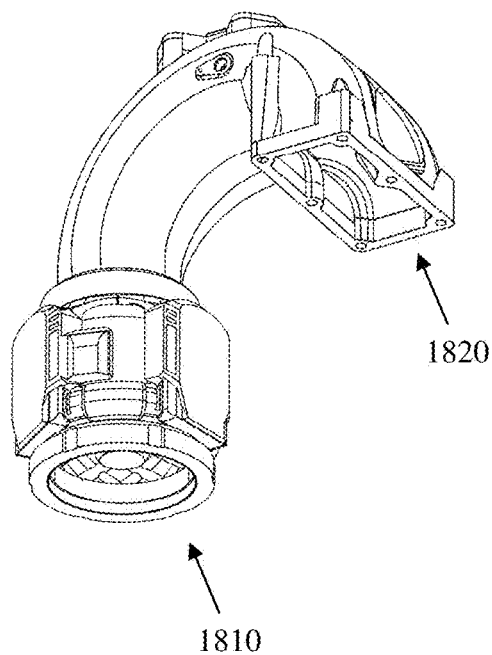
FIG. 18 depicts a plasma generator of the inventive subject matter incorporated into another air intake component.

FIG. 18 depicts an embodiment of the inventive subject matter where plasma generator 1810 is integrated with an air intake elbow of an ICE engine.

Figure 19:
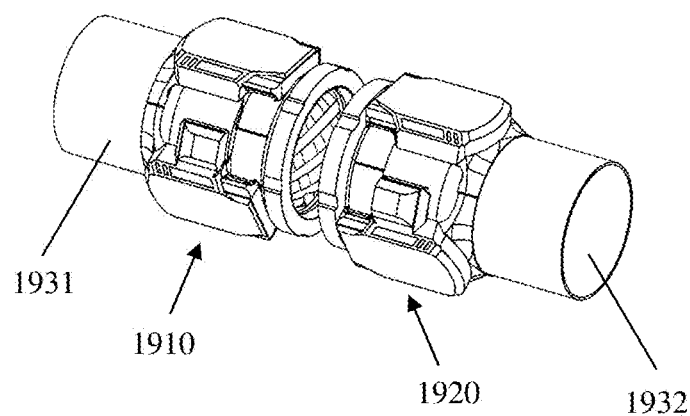
FIG. 19 depicts a system incorporating two plasma generators of the inventive subject matter.

FIG. 19 depicts a partially exploded view of an embodiment of the inventive subject matter where plasma generator 1910 and 1920 are coupled in series (e.g., face to face) in line with air intake tubes 1931 and 1932.

Figure 20:
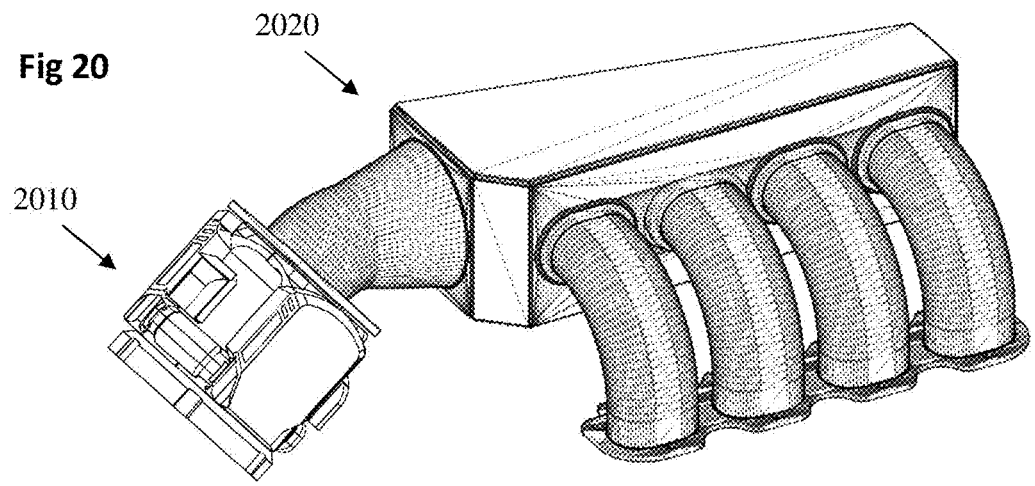
FIG. 20 depicts a plasma generator of the inventive subject matter incorporated into yet another air intake component.

FIG. 20 depicts a view of an embodiment of the inventive subject matter where plasma generator 2010 is coupled to a 4-cylinder manifold 2020 of an ICE engine.

Figure 21:
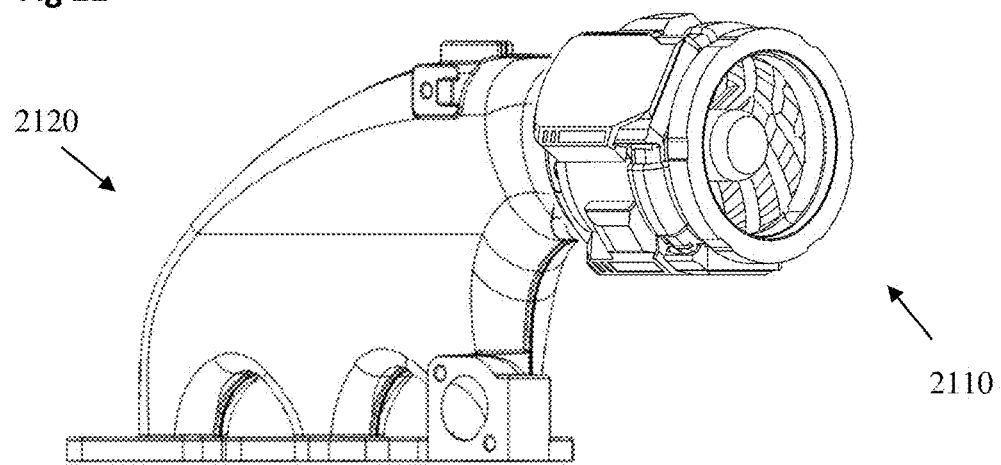
FIG. 21 depicts a plasma generator of the inventive subject matter incorporated into still another air intake component.

FIG. 21 depicts a view of an embodiment of the inventive subject matter where plasma generator 2110 is coupled to 3-cylinder manifold 2120 of an ICE engine.

Figure 22A:
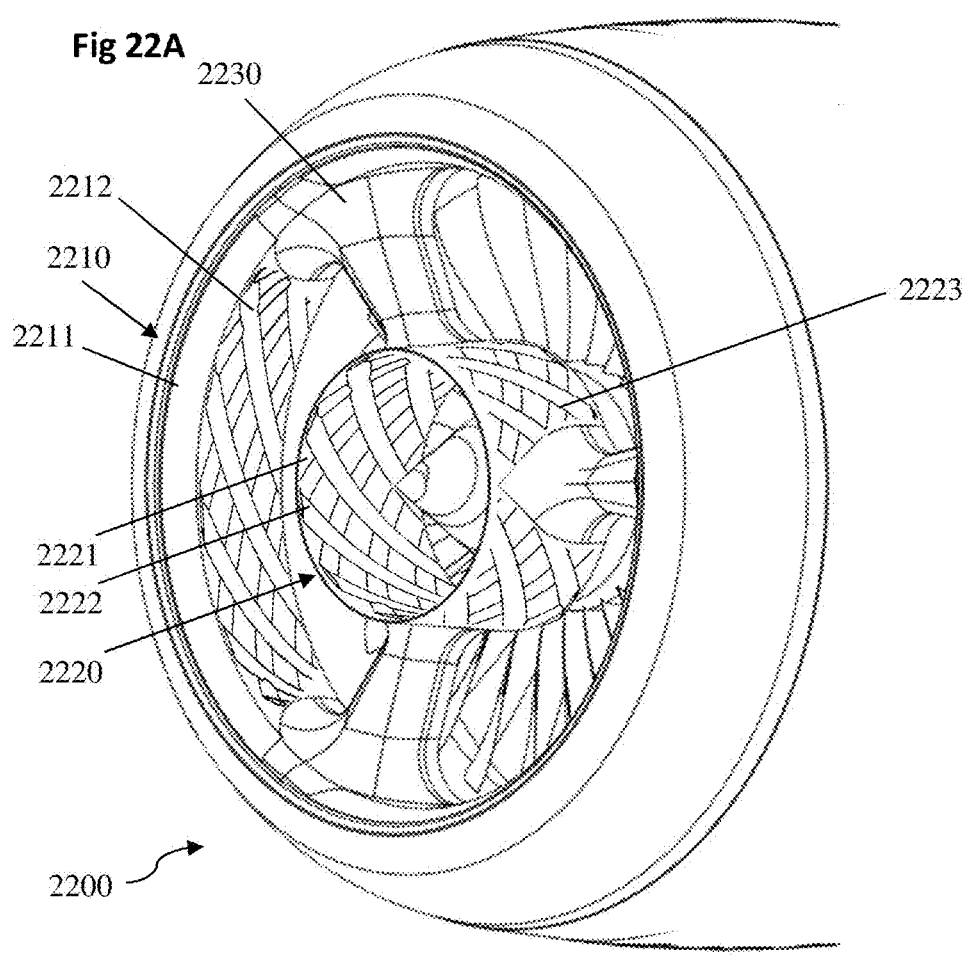
FIGS. 22A-22B depict a plasma generator of the inventive subject matter incorporated into a jet turbine engine.

FIG. 22A depicts jet turbine inlet cowl 2200 of the inventive subject matter. Jet turbine inlet cowl 2200 includes outer cylinder 2210, inner cylinder 2220 positioned approximately in the center of outer cylinder 2210, and support columns 2230 securing inner cylinder 2210 in position. Outer cylinder 2210 further includes dielectric material 2211 on an interior surface of the cylinder, with electrode pattern 2212 on dielectric material 2211. Inner cylinder 2220 includes dielectric material 2221 making up the wall of the cylinder, with electrode pattern 2222 disposed along the interior surface of inner cylinder 2220, and electrode pattern 2223 disposed along the outer surface of inner cylinder 2220.

Figure 22B:
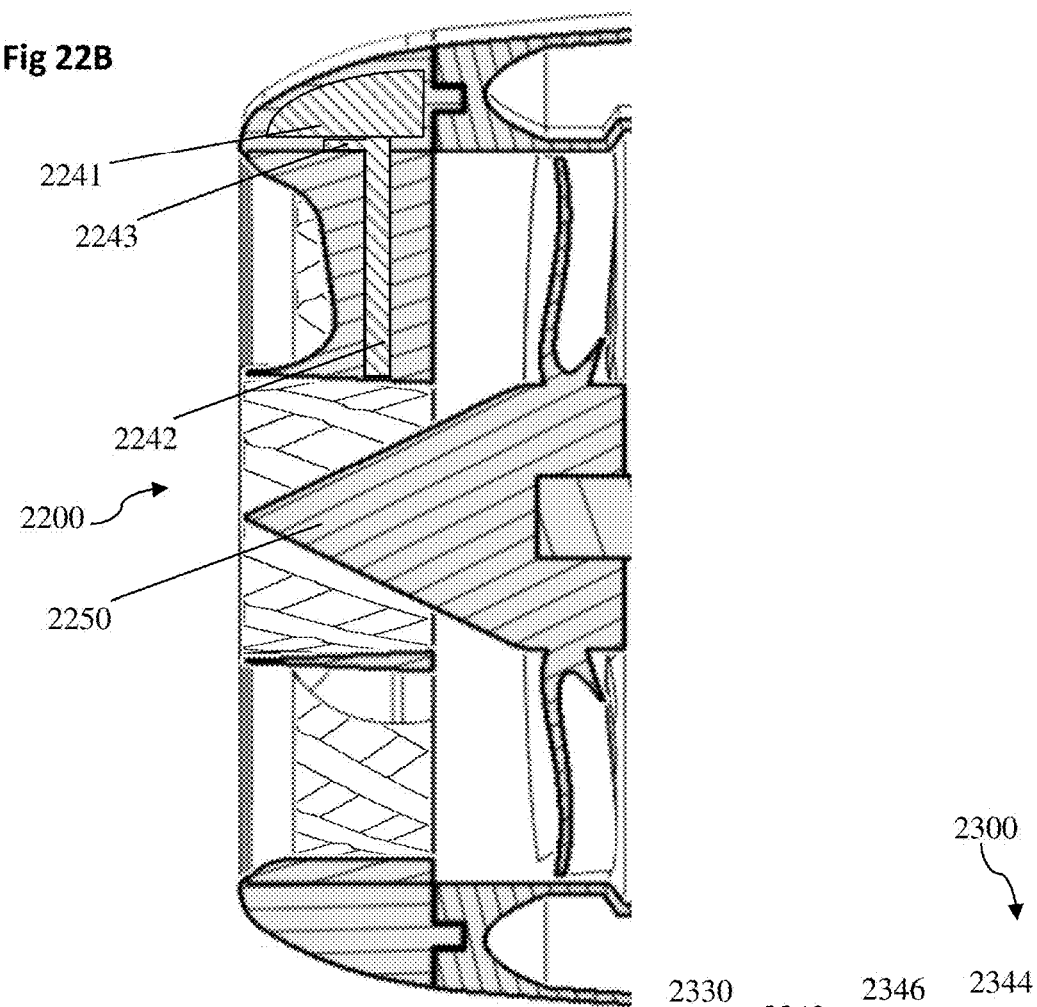

FIG. 22B depicts a cross section view of jet turbine inlet cowl 2200, further depicting power supply circuit 2241, ground wires 2242 and 2243, and compressor 2250. Power supply circuit 2241 operates the electrode patterns to generate plasma (e.g., DBD, arc, hybrid, etc). Ground wires 2242 and 2243 ground the inner cylinder and the inlet cowl, respectively.

Figure 23A:
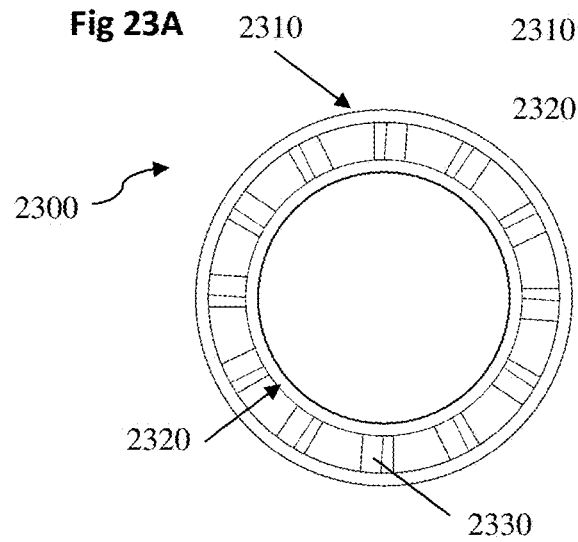
FIGS. 23A-23B depict still another plasma generator of the inventive subject matter.

FIG. 23A depicts an axial view of insulator electrode insert 2300 of the inventive subject matter, including outer cylinder 2210, inner cylinder 2220, and a plurality of tube electrodes 2330 (e.g., tube electrodes of FIG. 1) securing inner cylinder 2220 in place.

Figure 23B:
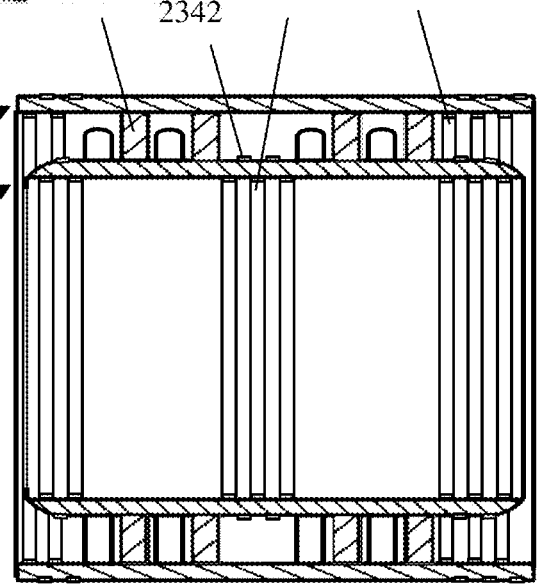

FIG. 23B depicts a cross section view of insulator electrode insert 2300. The plurality of tube electrodes 2330 are arranged in a pattern around inner cylinder 2320. Plasma actuator electrodes 2342 is arranged in a pattern about the outer circumference of inner cylinder 2320, while plasma actuator electrodes 2346 are arranged in a patter about the inner circumference of inner cylinder 2320. Plasma actuator electrodes 2344 are arranged in a pattern about the inner circumference of outer cylinder 2310.

Figure 24:
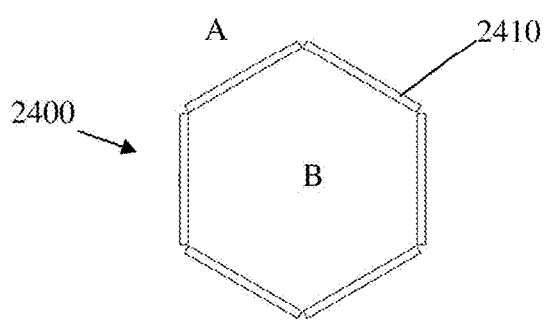
FIG. 24 depicts yet another component of a plasma generator of the inventive subject matter.

FIG. 24 depicts an axial view of insulator electrode insert 2400 of the inventive subject matter. Insulator electrode 2400 has a hexagonal shape (e.g., hexagonal prism) included six insulator electrode plates, made of dielectric material with electrode patterns disposed on the outer surface and the inner surface of each plate. The electrode patterns are operated to generate a plasma (e.g., DBD, arc, hybrid, etc) with an electrode charge distribution of negative charge in region A and positive charge in region B.

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A plasma generator comprising (i) a first and a second dielectric barrier discharge (DBD) electrode disposed at least partially proximal to a fluid stream, wherein the first DBD electrode generates a nonthermal plasma, and (ii) a plasma electrode, different than the first and the second DBD electrodes, disposed continuously along a circumference of an interior wall of the plasma generator.

2. The plasma generator of claim 1, wherein the first DBD electrode is a plasma actuator.

3. The plasma generator of claim 1, wherein the plasma electrode is confined to the circumference of the interior wall of the plasma generator, and is positioned upstream from the first DBD electrode.

4. The plasma generator of claim 2, wherein a wall of the first DBD electrode is a ground electrode for a first high voltage electrode positioned outside the wall.

5. The plasma generator of claim 4, wherein a wall of the second DBD electrode is a ground electrode for a second high voltage electrode positioned outside the wall of the second DBD electrode.

6. The plasma generator of claim 1, further comprising a third DBD electrode, wherein the first, second, and third electrodes are arranged in the fluid stream with respect to each other to complement the Von Karman Vortex Street fluid instability of matter passing through the fluid stream.

7. The plasma generator of claim 2, wherein the first and second DBD electrodes each have an axis along the greatest length of each electrode, respectively, and wherein the first and second DBD electrodes are positioned in the fluid stream such that each axis is perpendicular to a flow of matter in the fluid stream.

8. The plasma generator of claim 1, wherein the first and second DBD electrodes generate a plurality of oxidants about a reaction zone in the fluid stream, and wherein the plurality of oxidants treat matter in the fluid stream to increase combustion efficiency in a combustion chamber of an internal combustion engine (ICE).

9. A plasma generator comprising:
first plasma electrode disposed continuously along a circumference of an inner surface of the plasma generator, disposed in and at least partially exposed to a fluid stream; and
a DBD electrode disposed on an inner surface of the plasma generator, disposed in and at least partially exposed to the fluid stream.

10. The plasma generator of claim 9, wherein the plasma generator is positioned upstream from an exhaust gas recirculation (EGR) of an internal combustion engine (ICE), and wherein the DBD electrode is a second plasma actuator.

11. The plasma generator of claim 9, further comprising a cylinder disposed within and substantially parallel to a portion of the plasma generator, wherein the cylinder comprises a second plasma actuator electrode about a surface of the cylinder, and wherein the cylinder induces mixing of a plurality of radicals.

12. The plasma generator of claim 9, wherein the first plasma electrode generates a nonthermal plasma.

13. The plasma generator of claim 9, further comprising an electrically shielded circuit housing coupled to the plasma generator, wherein the electrically shielded circuit housing encloses a ground wire and a high voltage wire for a high voltage transformer.

14. The plasma generator of claim 13, wherein a reactor chamber of the plasma generator is grounded.

15. The plasma generator of claim 9, wherein at least one of the first plasma electrode or the DBD electrode uses plasma to create thrust in the fluid stream.

16. The plasma generator of claim 9, wherein the first plasma electrode is upstream of the DBD electrode and confined to the circumference of the inner surface.

17. The plasma generator of claim 9, wherein the first plasma electrode or the DBD electrode generates a plurality of radicals in the fluid stream, and wherein the plurality of radicals increase the combustion efficiency in a combustion chamber of an internal combustion engine (ICE).

18. The plasma generator of claim 9, wherein a first and a second power delivery module supplies power to the first plasma electrode and a second plasma electrode, independently.

19. The plasma generator of claim 11, wherein the cylinder is supported by a structural member extending radially from the cylinder, and wherein the structural member comprises an electrode.

20. A system wherein the plasma generator of claim 9 is structurally integrated in or separately appended to the air intake stream of an ICE device.

* * * * *